(12) United States Patent
Hari et al.

(10) Patent No.: US 8,611,074 B2
(45) Date of Patent: Dec. 17, 2013

(54) USER INTERFACE MOUNTING MODULE AND METHOD TO MOUNT A USER INTERFACE ON A UPS

(75) Inventors: Balasubramani Hari, Bangalore-Karnataka (IN); Shankar Gopalakrishna, Bangalore-Karnataka (IN); Arjun Jayaprakash, Bangalore-Karnataka (IN); Ravichandran Sankaranarayanan, Bangalore-Karnataka (IN); Murtige Prahlada, Bangalore-Karnataka (IN)

(73) Assignee: Schneider Electric IT Corporation, West Kingston, RI (US)

( * ) Notice: Subject to any disclaimer, the term of this patent is extended or adjusted under 35 U.S.C. 154(b) by 217 days.

(21) Appl. No.: 13/198,486

(22) Filed: Aug. 4, 2011

(65) Prior Publication Data

US 2013/0033801 A1    Feb. 7, 2013

(51) Int. Cl.
*G06F 1/16* (2006.01)
(52) U.S. Cl.
USPC ............... 361/679.01; 345/168; 340/854.3; 362/619
(58) Field of Classification Search
USPC .......... 345/156, 168, 169, 1.1, 173, 174, 589, 345/211, 690, 214, 87, 549, 107, 30, 55, 345/177; 361/736, 746, 679.08, 679.54, 361/679.01, 679.28, 679.17, 679.55, 361/679.04, 679.21, 679.09, 679.47, 361/679.52, 679.27, 679.06, 679.23, 361/679.03, 679.05; 340/854.3, 407.1; 362/235, 245, 97.1, 602, 619
See application file for complete search history.

(56) References Cited

U.S. PATENT DOCUMENTS

| 4,267,555 | A | 5/1981 | Boyd et al. |
| 5,793,627 | A | 8/1998 | Caldes et al. |
| 2005/0017582 | A1 | 1/2005 | Young |
| 2009/0314912 | A1 | 12/2009 | Whitley et al. |
| 2012/0127645 | A1* | 5/2012 | Quero et al. ............... 361/679.4 |
| 2013/0039018 | A1* | 2/2013 | Holverson et al. ............ 361/736 |

OTHER PUBLICATIONS

International Search Report and Written Opinion of the International Searching Authority from corresponding PCT application No. PCT/US2012/049175, dated Oct. 16, 2012.

* cited by examiner

*Primary Examiner* — Hung Duong
(74) *Attorney, Agent, or Firm* — Lando & Anastasi, LLP (57) ABSTRACT

A mechanism for adjusting the orientation of a user interface of an electronic system component from a rack mounted orientation to a tower orientation.

20 Claims, 10 Drawing Sheets

USER INTERFACE MOUNTING MODULE AND METHOD TO MOUNT A USER INTERFACE ON A UPS

BACKGROUND

1. Field of Disclosure

Aspects and embodiments of the present disclosure are directed generally toward user interfaces for use in electronic system components, for example, components of an uninterruptible power supply (UPS), and more specifically, to user interface mounting modules for adjusting the orientation of a user interface of a UPS from a rack mounted orientation to a tower orientation or from a tower orientation to a rack mounted orientation.

2. Discussion of Related Art

End users of UPS systems frequently request increased functionality with regard to control of the systems and information about the performance of the systems. For example, end users often desire visual interface modules that the end users can access and interact with to obtain information or input control commands to a UPS system. These user interface modules may include, by way of example, LED indicators and accompanying keypads, LCD displays with accompanying keypads, and touch screen interfaces. Standardized mechanisms exist for mechanically securing such user interface modules in a UPS system in a fixed orientation.

Some UPS systems have the flexibility to be either vertically oriented in, for example, a stand alone tower configuration, or horizontally mounted in, for example, a rack mount configuration. Similarly, some UPS system components are convertible by an end user between a horizontal mount configuration when orienting the UPS system horizontally and a vertical mount configuration when orienting the UPS system vertically with minor modification to the components. When adjusting the configuration of a UPS system component, it is often desirable to adjust the orientation of a user interface associated with the UPS system component so that it corresponds to the orientation of the UPS system.

Presently available mounting systems for user interfaces which provide for the ability to adjust the configuration of the user interface are typically bulky, taking up valuable space within the chassis of an electronic system component, are mechanically fragile and structurally unstable, and are difficult to use.

Figure 1:
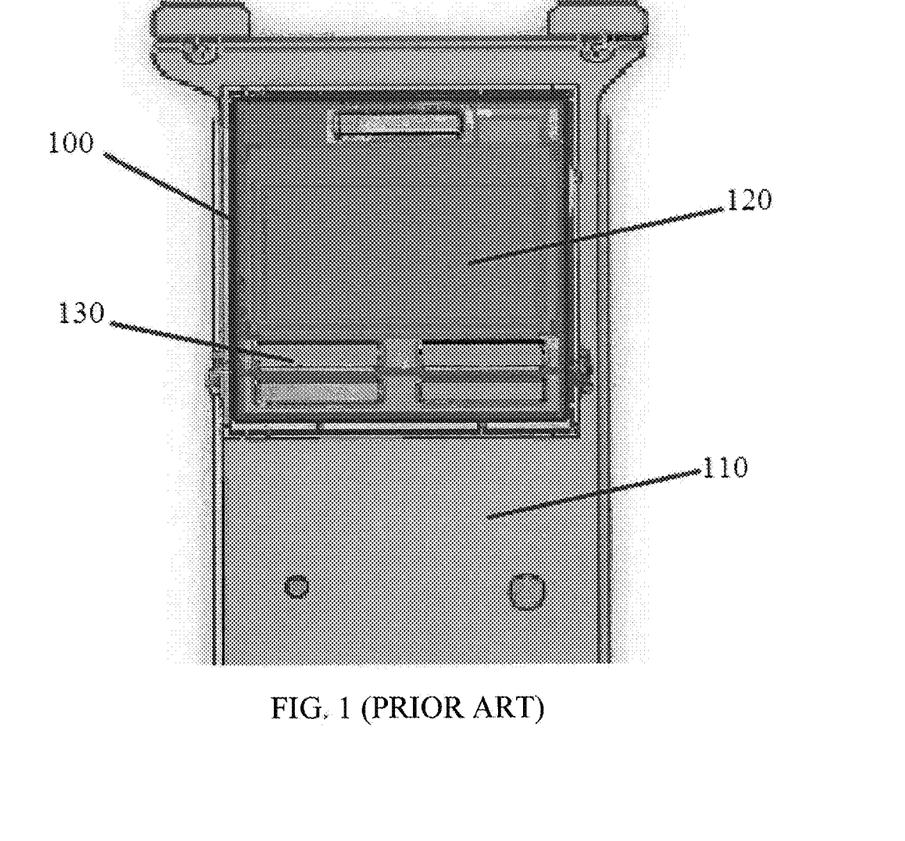
FIG. 1 is an elevational view of an embodiment of a prior art user interface mounted on a component of a UPS system oriented in a tower configuration.
Figure 2:
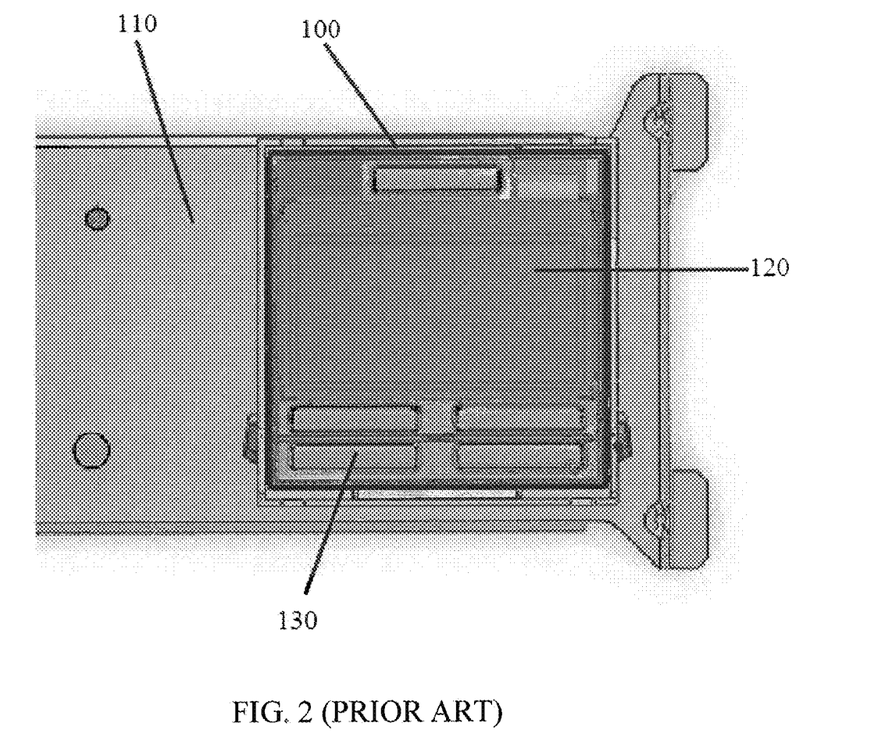
FIG. 2 is an elevational view of an embodiment of a prior art user interface mounted on a component of a UPS system oriented in a rack mount configuration.

An example of a user interface for an electronic system component such as a UPS system component is illustrated in FIG. 1 and FIG. 2. The exemplary user interface is indicated at 100. The user interface 100 is illustrated mounted on a surface of an electronic system component, which may comprise a UPS system component chassis, indicated at 110. FIG. 1 illustrates the UPS system component arranged in a tower configuration. FIG. 2 illustrates the UPS system component arranged in a rack mount configuration. In FIG. 1 and FIG. 2, a display on the user interface 100 is indicated at 120. The display may include any one or more of LED indicators, an LCD display, a touch screen interface, or other form of information and/or interactive display. Buttons, indicated at 130, may be included on some examples of user interfaces to provide for the entry of information by a user.

Figure 3:
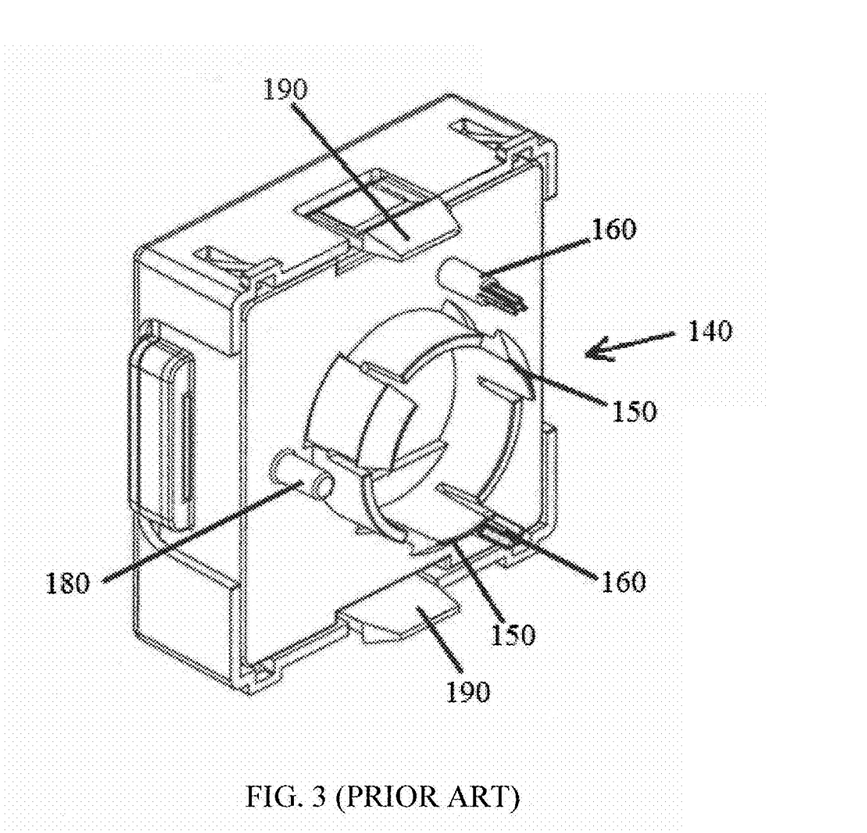
FIG. 3 is an isometric view from the rear of a prior art user interface mounting module.
Figure 4:
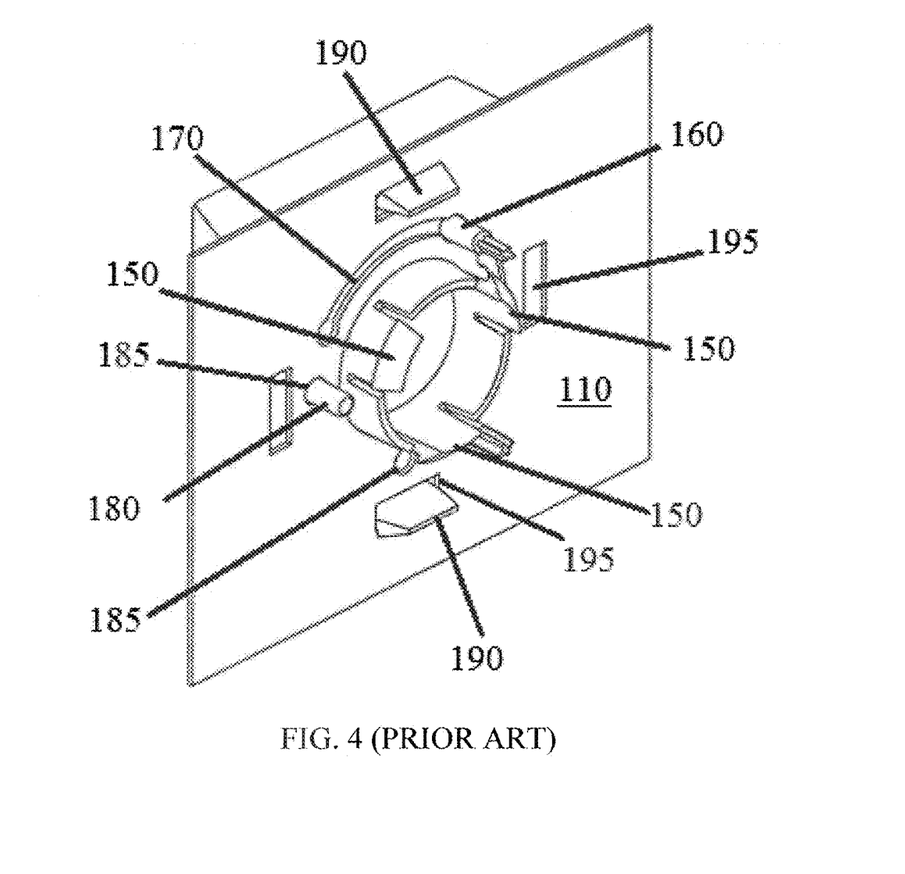
FIG. 4 is an isometric view of the prior art user interface mounting module of FIG. 3 mounted to a portion of an electronic system component chassis.

User interfaces are in some instances supplied as standalone components that may be mounted to an electronic system, such as a UPS system, using a user interface mounting module. An example of a former design of a UPS component user interface mounting module is illustrated in FIG. 3 and FIG. 4, indicated generally at 140. In FIG. 3 the module 140 is illustrated alone, and in FIG. 4, the module is illustrated mounted to a cut away portion of a chassis of a UPS system component 110. In the user interface mounting module 140 of FIG. 3 and FIG. 4, the tabs 150 secure the module 140 to the chassis of a UPS system component and prevent the module from being disengaged from the chassis. Two pins 160 are retained within a guide 170 during rotational motion of the module. To rotate the module, retaining latches 190 must be disengaged from retaining apertures 195 in the wall of the chassis of the UPS system component 110. The retaining latches 190 may be accessed from the outside of the body of the UPS system component. The retaining latches 190 are pressed inward such that shoulder portions of the retaining latches 190 may fit through the retaining apertures 195, and the module is pulled away from the external surface of the chassis of the UPS system component toward the user. The module is pulled away from the external surface of the chassis of the UPS system component until the posts 180 clear the post apertures 185. The module 140 is rotated to the desired orientation and then replaced onto the UPS system component chassis by pushing the module forward onto the external surface of the chassis until the retaining latches 190 engage the retaining apertures 195 and return to a locked position.

SUMMARY

Aspects and embodiments of the present disclosure provide for a UPS component user interface mounting module that is easier to use and which is mechanically more robust than previously known user interface mounting modules. Some aspects and embodiments of the present disclosure provide for a UPS component user interface mounting module that is more compact and is easier to assemble than previously known user interface mounting modules.

In accordance with an aspect of the present disclosure, there is provided a user interface mounting module for mounting a user interface to an electronic system component including a chassis. The user interface mounting module comprises a main body having a rear face, a front face, and a plurality of sidewalls, a recess defined by the front face and the plurality of sidewalls, the recess being configured to receive and mount the user interface to the main body, and an indexing detent attached to a spring affixed to the rear face and configured to engage one or more attachment features on the chassis. The main body is configured to be secured to an external surface of the chassis in one of two positions including a first position in which the user interface is vertically oriented and the indexing detent engages the one or more attachment features and a second position in which the user interface is horizontally oriented.

In accordance with some embodiments, the electronic system component comprises a component of a UPS system.

In accordance with some embodiments, the user interface mounting module further comprises an aperture located generally centrally in the rear face, the aperture being configured to enable an electrical connection from the user interface to the electronic system component.

In accordance with some embodiments, the user interface mounting module further comprises a locating guide disposed on the rear face and extending in a rear direction from the rear face.

In accordance with some embodiments, the user interface mounting module further comprises a locking tab flexibly affixed to the rear face and extending in a rear direction from the rear face.

In accordance with some embodiments, the main body is configured to rotate between the first and the second position upon application to the main body of a solely rotational force relative to the external surface of the chassis.

In accordance with some embodiments, the user interface mounting module further comprises a stopper affixed to the rear face.

In accordance with another aspect of the present disclosure, there is provided an electronic system component. The electronic system component comprises a chassis configured to house components of the electronic system component, the chassis including an attachment aperture configured to receive a user interface on an external surface thereof and one or more mounting features, and a user interface mounting module. The user interface mounting module includes a main body having a rear face, a front face, and a plurality of sidewalls, a recess configured to receive and mount a user interface module in the user interface mounting module, and an indexing detent attached to a spring affixed to the rear face and configured to engage the one or more mounting features on the chassis. The main body is configured to be secured to the chassis in one of two positions including a first position in which the user interface is vertically oriented and the indexing detent engages the one or more mounting features and a second position in which the user interface is horizontally oriented.

In accordance with some embodiments, the attachment aperture is configured to retain a portion of the user interface mounting module and provide for rotation of the user interface mounting module with respect to the chassis.

In accordance with some embodiments, the electronic system component comprises a component of a UPS system.

In accordance with some embodiments, the indexing detent is configured to releasably lock the user interface mounting module in place in one of the first and second positions.

In accordance with some embodiments, the main body of the user interface mounting module further includes an aperture located generally centrally in the rear face.

In accordance with some embodiments, the one or more mounting features comprise a dimple formed on an internal wall of the chassis.

In accordance with some embodiments, the user interface mounting module further includes a locating guide disposed on the rear face and extending in a rear direction from the rear face.

In accordance with some embodiments, the user interface mounting module further includes a locking tab flexibly affixed to the rear face and extending in a rear direction from the rear face.

In accordance with some embodiments, the user interface mounting module further includes a stopper affixed to the rear face.

In accordance with another aspect of the present disclosure, there is provided a method of securing a user interface to a chassis of an electronic system component. The method comprises providing a user interface mounting module including a main body having a rear face, a front face, and a plurality of sidewalls, a recess configured to receive and mount the user interface in the user interface mounting module, and a mounting feature. The method further comprises securing the mounting feature in an aperture formed in the chassis, the mounting feature and aperture configured to provide for the main body of the user interface mounting module to rotate with respect to the chassis between one of two positions including a first position in which the user interface is vertically oriented and a second position in which the user interface is horizontally oriented while the mounting feature is secured in the aperture upon application of a solely rotational force, and securing the user interface to the user interface mounting module.

In accordance with some embodiments, the method further comprises rotating the user interface mounting module with respect to the chassis and releasably locking the user interface mounting module in place in one of the first position and the second position.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

This disclosure is not limited in its application to the details of construction and the arrangement of components set forth in the following description or illustrated in the drawings. The disclosure is capable of other embodiments and of being practiced or of being carried out in various ways. Also, the phraseology and terminology used herein is for the purpose of description and should not be regarded as limiting. The use of "including," "comprising," "having," "containing," "involving," and variations thereof herein is meant to encompass the items listed thereafter and equivalents thereof as well as additional items.

User interfaces may be mounted to an external surface of a component of an electronic system, for example, a UPS system, to provide information to an end user regarding the operation of the system and/or to provide for the end user to input commands to the system. Such user interfaces may be interactive and may include a display or other mechanism for visually displaying information to a user.

A user interface mounting module may be utilized to couple a user interface to an electronic system component, for example, to a chassis of the component. Some embodiments of a user interface mounting module in accordance with the present disclosure may have advantages over the user interface mounting module of FIG. 3 and FIG. 4, discussed above. Embodiments of a user interface mounting module in accordance with the present disclosure may have a simple construction, may be easily operable by an end user, may be field replaceable and serviceable, and may occupy little space within an electronic system component, for example, within a UPS system component chassis.

Some embodiments of a user interface mounting module in accordance with the present disclosure may include a main body to which a user interface may be secured. Embodiments of the user interface mounting module may include one or more features for mounting the user interface mounting module onto a surface of an electronic system component. The mounting feature or features may releasably lock the user interface mounting module in one or more alternate orientations on the chassis of the electronic system component. The orientation of the user interface mounting module may be adjusted by a user from outside the chassis of the electronic system component. The orientation of the user interface mounting module may be adjusted by a user applying solely a rotational force to the user interface mounting module. A force pushing or pulling the user interface mounting module toward or away from a surface on which it is mounted may not be required to adjust the orientation of the user interface mounting module. The user interface mounting module may be installed on and/or removed from the chassis of the electronic system component without the need to access an internal volume of the chassis and without the need to disassemble the user interface mounting module.

Figure 5:
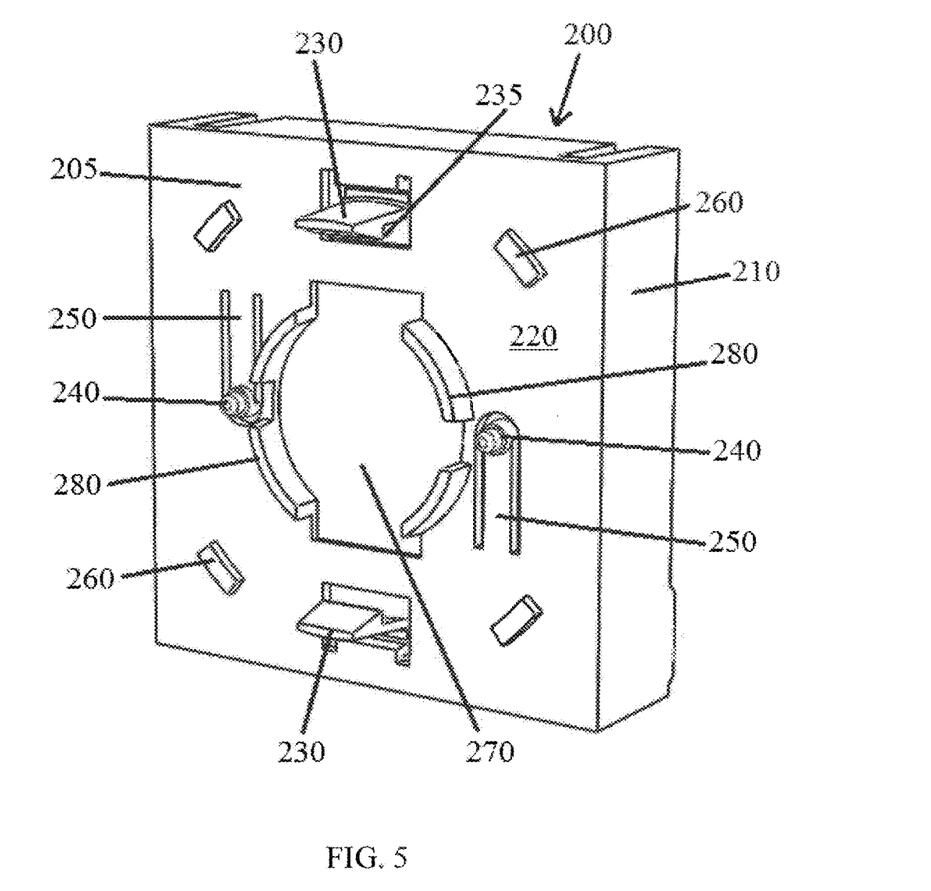
FIG. 5 is an isometric view from the rear of a first embodiment of a user interface mounting module of the present disclosure.

An embodiment of a user interface mounting module of the present disclosure is illustrated in FIG. 5, indicated generally at 200. The user interface mounting module 200 illustrated in FIG. 5 provides for a functional and easily operable mechanism for converting a user interface from a rack mount configuration to a tower mount configuration and/or from a tower mount configuration to a rack mount configuration. The user interface mounting module comprises mounting features including locking tabs and one or more detents which may in some embodiments be designed as an integral part of the main body of the user interface mounting module. The locking tabs and detents may function to releasably hold the user interface mounting module in place in a desired orientation when mounted to a chassis of an electronic system component.

Figure 6:
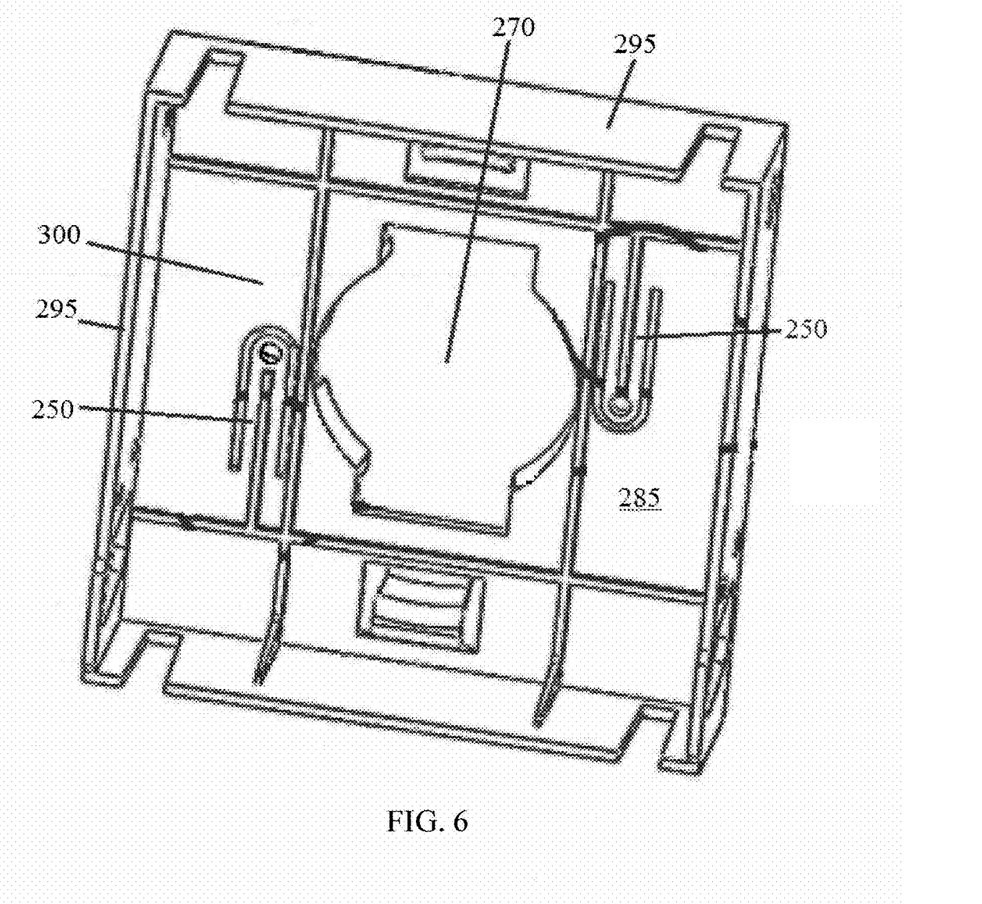
FIG. 6 is an isometric view from the front of the user interface mounting module of FIG. 5.

As illustrated in FIG. 5 and FIG. 6, the user interface mounting module 200 includes a main body 210 with a primary wall 205 and a sidewall 295. The primary wall 205 includes a rear face 220 on one surface of the primary wall 205 and a front face 285 on an opposite surface of the primary wall. A recess 300 for mounting a user interface within the user interface mounting module is defined by the front face 285 of the primary wall 205 and the sidewall 295.

A pair of locking tabs 230 are provided on the rear face 220 of the main body 210. In use, the locking tabs 230 may cooperate with locking slots on an electronic system component, which are described in detail below, to secure the user interface mounting module 200 to a surface of the electronic system component. In some embodiments, the locking tabs 230 are attached to the main body 210 by flexible resilient hinges, which may be integrally formed with the main body. Each locking tab 230 may include a shoulder portion 235 or protrusion on a portion of the locking tab distanced from the end of locking tab attached to the rear face 220 of the main body 210. The locking tabs 230 are designed to flex when securing the user interface mounting module 200 to a surface of an electronic system component.

A pair of indexing detents, each indicated at 240, are mounted on a respective pair of indexing arms 250, which are flexibly attached to the primary wall 205 of the main body 210. Each indexing arm 250 is attached to the main body 210 on an end opposite to an end including the detent 240, thereby forming a spring which resists displacement of the indexing arm 250 out of the plane defined by the rear face 220 of the main body 210. The indexing arms 250 are sufficiently flexible to enable the indexing detents 240 to move inward and outward in a direction generally normal to the plane defined by the rear face 220 of the main body 210. The indexing arms 250 may exert a biasing force on the indexing detents 240 when the indexing detents 240 are displaced from a resting position due to elastic stress induced in the indexing arms 250 by the displacement of the indexing detents 240. In alternate embodiments, a spring (not shown), such as a coil spring, or another biasing mechanism, may serve to provide a biasing force on the indexing detents 240.

A number of stopper tabs, each indicated at 260, whose function will be described below, may also be included on the rear face 220 of the main body 210.

The main body 210 further includes a generally centrally positioned aperture 270. The aperture 270 provides an opening to enable an electrical connection between a user interface mounted in the user interface mounting module 200 and components internal to an electronic system component to which the user interface mounting module 200 may be affixed. A locating guide, for example, guide ring 280, which may comprise one or more sections, surrounds at least a portion of a circumference of the aperture 270.

In use, a user interface, such as user interface 100, is secured in the recess 300 formed in the front of the user interface mounting module 200 and defined by the primary wall 205 and the side wall 295. Any suitable mechanism, for example, adhesives, screws, locking tabs, hook and loop fasteners, etc., may be utilized to secure the user interface within the recess 300. An electrical connector 290, illustrated in FIG. 8, of the user interface may extend through, or be accessible from the rear face 220 of the user interface mounting module through the aperture 270.

A portion of a chassis or other part, for example, a wall or door of an electronic system component may be provided with, or may be modified to include one or more features which facilitate the attachment of an embodiment of a user interface mounting module in accordance with the present disclosure. These attachment features may include, for example, one or more apertures, slots, or through holes formed in the chassis or other part of the electronic system component. The one or more apertures, slots, or through holes may be shaped and arranged to receive and/or retain one or more of a locking tab 230 and/or a guide ring 280 of embodiments of a user interface mounting module in accordance with the present disclosure. These attachment features may also include one or more dimples. The dimples may be sized, shaped, and arranged to receive and/or retain one or more indexing detents 240 of a user interface mounting module in accordance with the present disclosure.

Figure 7:
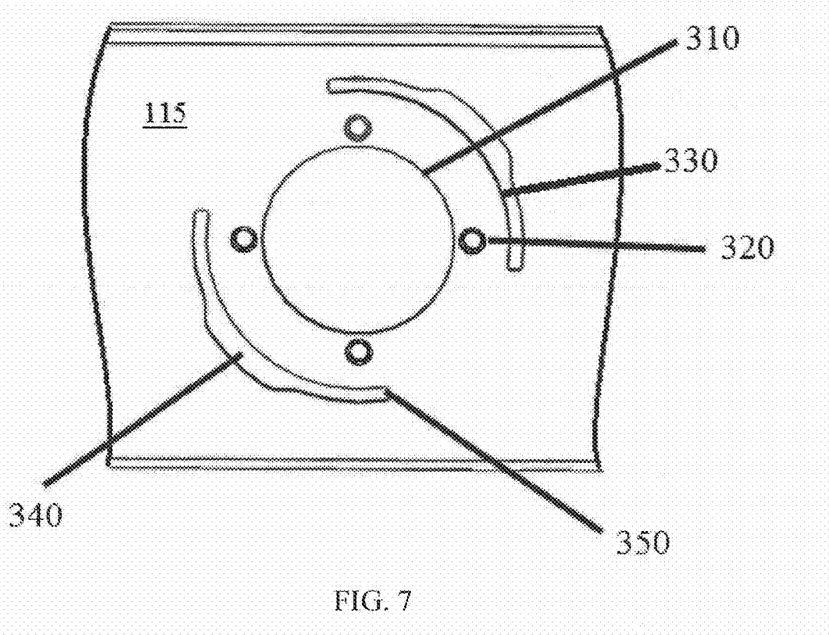
FIG. 7 is an elevational view of attachment apertures for the user interface mounting module of FIG. 5 formed in wall of a chassis of an electronic system component.

Referring to FIG. 7, a wall of a chassis 110 of an electronic system component, for example, a UPS system component, includes one or more attachment features to facilitate attachment of a user interface mounting module 200. The attachment features include a locating aperture 310, indexing dimples 320, and guide slots 330. As illustrated in FIG. 7, the locating aperture 310 may be substantially circular or circular in shape. In use, a guide ring 280 of a user interface mounting module 200 may cooperate with the locating aperture 310 to facilitate positioning the user interface mounting module 200 on the electronic system component.

The guide slots 330 may each be provided with a locking tab insertion area 340, which has a width greater than the remainder of the guide slots 330. The locking tab insertion area 340 formed in the electronic system component chassis 110 and the locking tabs 230 of a user interface mounting module 200 may be sized such that the locking tabs 230 fit through the locking tab insertion areas 340, but may not be removable through other regions of the guide slots 330. The guide slots 330 may terminate in stopping points 350, which may limit the range of rotation of a user interface mounting module 200 affixed to the electronic system component chassis by limiting the range of travel of the locking tabs 230 through the guide slots 330. The stopping points 350 may also be defined as points along the guide slots at which the locking tabs may rest when one or more of the indexing detents 240 align with one or more of the indexing dimples 320 and releasably hold the user interface mounting module 200 in place as described below.

After the user interface mounting module 200 is secured to the electronic system component chassis 110 by insertion of the guide ring 280 through the locating aperture 310 and insertion of the locking tabs 230 into the guide slots 330, the user interface mounting module 200 may be rotated relative to a surface of the electronic system component chassis 110. As the user interface mounting module 200 is rotated, the locating aperture 310 limits motion of the guide ring 280 to rotational motion, and the locking tabs 230 are constrained to move through the guide slots 330. When the user interface mounting module 200 is in a position such that one or more of the indexing detents 240 align with one or more of the indexing dimples 320, the indexing detents 240 are pushed into the indexing dimples 320 by a force provided by the indexing arms 250. Retention of the indexing detents 240 in the indexing dimples 320 by friction and by the biasing force provided by the indexing arms 250 may provide a force resisting further rotation of the user interface mounting module 200. The indexing dimples 320 may thus serve to releasably retain the user interface mounting module 200 affixed to the electronic system component chassis 110 in place in a specific orientation.

As illustrated in FIG. 7, the indexing dimples 320 may be positioned such that indexing detents 240 arranged on the user interface mounting module 200 lock into place in one of two positions. These positions may be such that a user interface mounted in the user interface mounting module 200 will be in either a rack mount configuration (with the display of the interface positioned vertically with regard to a long axis of the electronic component chassis) or a tower mount configuration (with the display of the interface positioned vertically with regard to a short axis of the electronic component chassis) when the indexing detents 240 lock into place in the indexing dimples 320.

In different embodiments, more or fewer indexing detents 240 may be provided on the user interface mounting module and/or more or fewer indexing dimples 320 may be provided on the chassis, resulting in a different number and/or location of positions which the user interface mounting module may lock into relative to the chassis. Further, in different embodiments, one or more of the indexing dimples 320 may be formed as through holes or as depressions in the wall of the chassis 110. In different embodiments, the indexing dimples 320 may be formed or shaped in any manner such that they are capable of receiving and/or retaining one or more indexing detents 240 of an embodiment of a user interface mounting module 200 in accordance with the present disclosure.

One or both of the indexing detents 240 and the indexing dimples 320 may be provided with slanted side walls, such that a sufficient rotational force applied to the user interface mounting module 200 will force the indexing detents 240 out from the indexing dimples 320. For example, in some embodiments, the indexing dimples 320 may be hemispherical, conical, or frustoconical in shape. Upon application of sufficient rotational force to the main body 210 of the user interface mounting module 200, the force provided by the indexing arms 250 holding the indexing detents 240 in the indexing dimples 320 may be overcome, urging the indexing detents 240 out of the respective indexing dimples 320 and allowing further rotational motion of the user interface mounting module 200 relative to the chassis 110.

The stopper tabs 260 on the rear face 220 of the main body 210 of the user interface mounting module 200 may serve to hold the majority of the rear face 220 away from contact with an external wall of the chassis 110 of the electronic system component, thus reducing friction which could render rotation of the user interface mounting module 200 more difficult. In some embodiments, the stopper tabs 260 may be fixed bodies applied to the rear face 220 of the user interface mounting module 200. In other embodiments, the stoppers 260 may be mounted on springs similar to the indexing arms 250 or on other biasing mechanisms such as coil springs. This may provide for the stoppers 260 to extend from the rear face 220 of the user interface mounting module 200 for different distances and facilitate contact with a surface of different electronic component chassis with different wall thicknesses.

Figure 8:
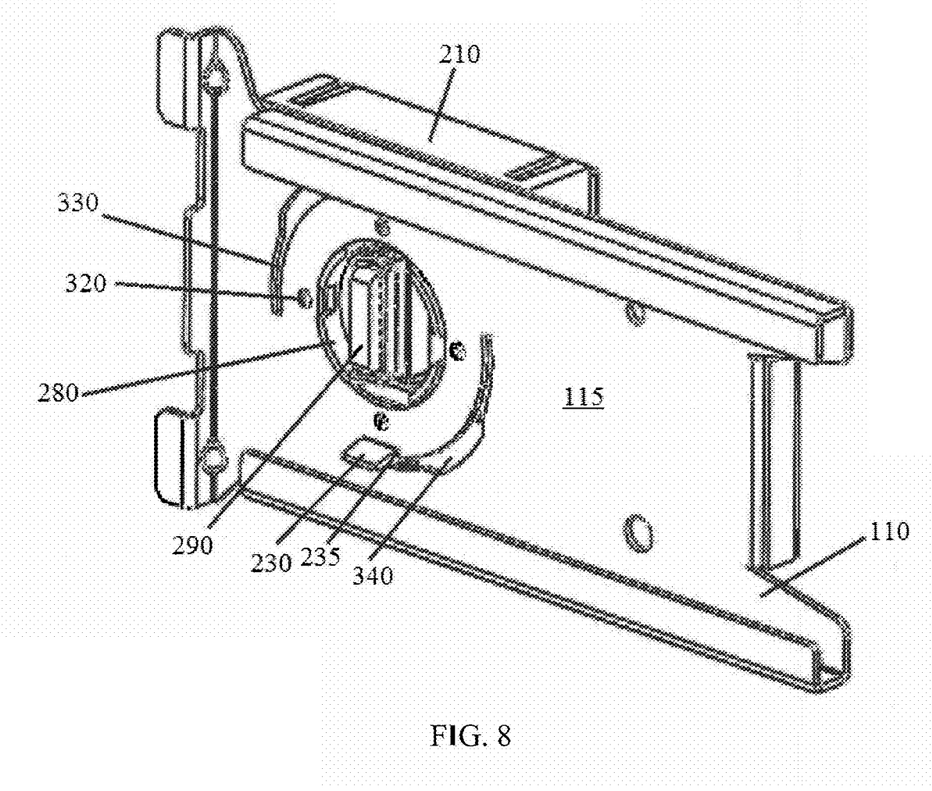
FIG. 8 is an isometric view of the user interface mounting module of FIG. 5 affixed to a surface of a chassis of an electronic system component.

FIG. 8 illustrates a user interface mounting module 200 affixed to a wall 115 of a section of a chassis of an electronic system component. FIG. 8 shows the chassis wall from a view inside the electronic system component. The chassis wall 115 is an internal wall of the section of the chassis component illustrated in FIG. 8. For clarity, the remainder of the chassis 110 is not illustrated. The guide ring 280 of the user interface mounting module 200 is illustrated extended through the locating aperture 210 on the wall of the chassis 110. The locking tabs 230 (only one is visible in FIG. 8) are located in the guide slots 330 at stopping points 350. The locking tabs 230 are dimensioned such that when installed there is little, if any clearance between the shoulder portions 235 of the locking tabs 230 and the inner wall 115 of the chassis 110. The stoppers 260 may bias the user interface mounting module 200 outward from the interior of the chassis 110 until the shoulder portions 235 of the locking tabs 230 contact the inner wall 115 of the chassis 110. An electrical connector 290 of a user interface 100 is illustrated extending through the aperture 270 in the main body 210 of the user interface mounting module 200 and into an internal volume of the electronic system component chassis 110.

Figure 9:
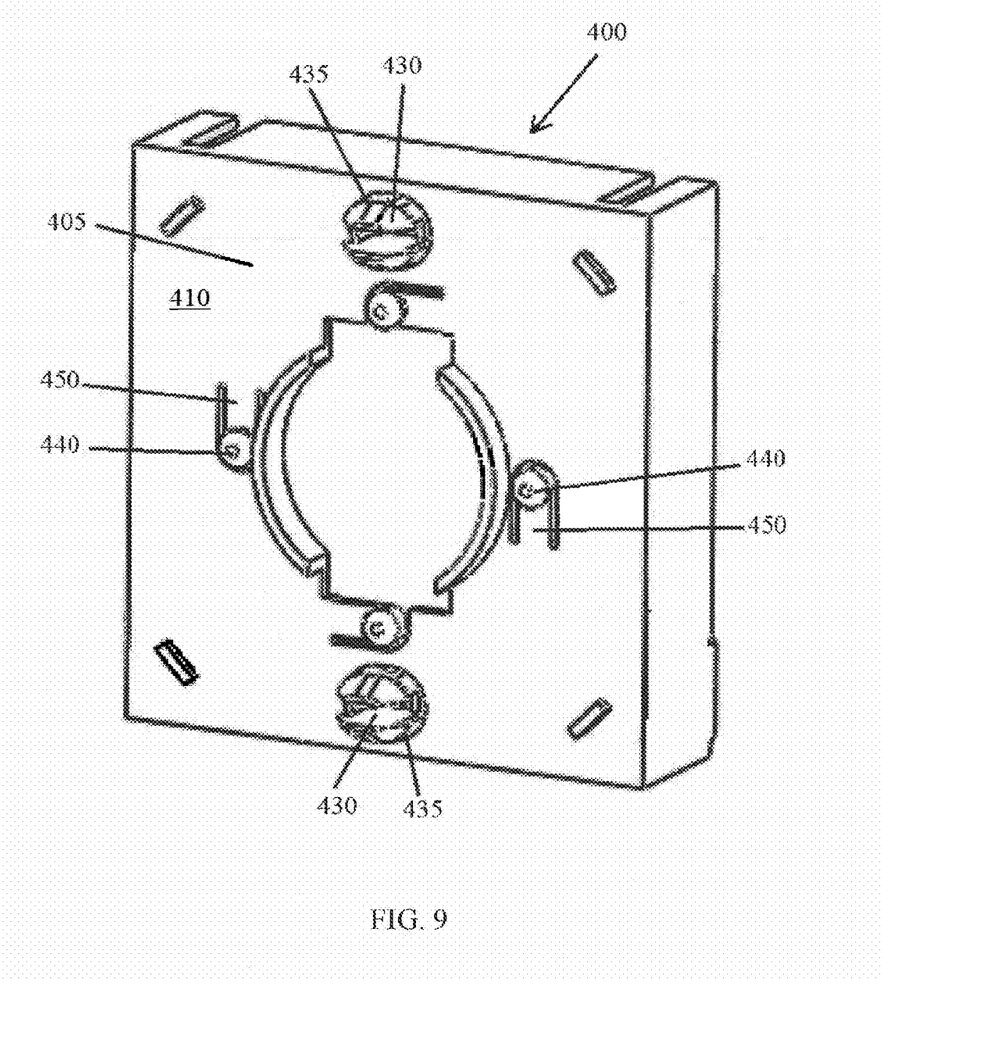
FIG. 9 is an isometric rear view of a second embodiment of a user interface mounting module of the present disclosure.

A second embodiment of a user interface mounting module of the present disclosure, indicated generally at 400, is illustrated in FIG. 9. The user interface mounting module of FIG. 9 has a primary wall 405 including a rear face 410. In this embodiment, the locking tabs 230 of the user interface mounting module 200 are replaced by a pair of split arm snaps 430. The split arm snaps 430 may include shoulder portions 435 or protrusions on portions of the split arm snaps 430 distanced from ends of the split arm snaps 430 connected to the primary wall 405 of the user interface mounting module 400. The arms of the split arm snaps 430 may be biased apart, but may be pushed toward one another to facilitate passing the split arm snaps 430 through apertures formed in an electronic system component chassis, which is described below with reference to FIG. 10. The split arm snaps perform a similar function as the locking tabs 230 of the embodiment illustrated in FIG. 5, described above. The embodiment illustrated in FIG. 9 also includes four indexing detents 440, each mounted on a respective indexing arm 450. The indexing detents 440 and indexing arms 450 perform similar functions as the indexing detents 240 and indexing arms 250 of the embodiment illustrated in FIG. 5, described above.

Figure 10:
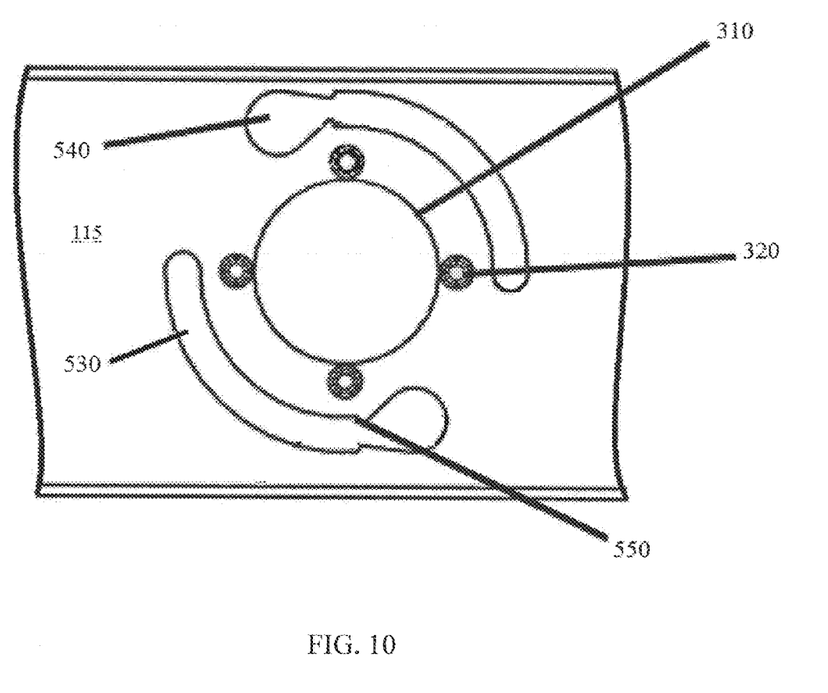
FIG. 10 is an elevational view of attachment apertures for the user interface mounting module of FIG. 9 formed in a wall of a chassis of an electronic system component.

Mounting apertures for a user interface mounting module 400 as illustrated in FIG. 9 may be formed in a wall of a chassis or door of an electronic system component as illustrated in FIG. 10. As shown in FIG. 10, snap insertion areas 540 of guide slots 530 may be rounded as compared to the locking tab insertion areas 440 illustrated in FIG. 7. As also illustrated in FIG. 10, stopping points 550 may be located substantially closer to an end of the guide slots 530 than is illustrated in FIG. 7.

The embodiments of the disclosure described above may be modified in various ways and still fall within the scope of the present disclosure. For example, the materials of construction of the various embodiments described may include plastics, metals, composites, combinations of these, or any other materials deemed suitable. Embodiments of the user interface mounting module may be formed with one or more of the above described features, such as the locking tabs, stoppers, indexing arms, etc., integral to the main body. For example, the user interface mounting module may be formed of a plastic material in an injection molding process. Alternately, various features of the user interface mounting module may be formed separately and joined together by, for example, welding, gluing, by attachment mechanisms such as screws, bolts, or locking tabs, or by other methods known in the art.

The number of detents, locking tabs, split arm snaps, guide rings, guide slots, and other features of the embodiments described above are not limited to the numbers of these features illustrated in the accompanying figures. More or fewer of any one or more of these features may be present in different embodiments. The locations and shapes of features of various alternate embodiments are not limited to what is described above. For example, the guide ring 280 need not be proximate the aperture 270 in the body of a user interface mounting module. The guide ring may be spaced from the aperture 270 and/or replaced by alternate features such as pins or tabs. In other embodiments, the aperture 270 may be shaped in any of different shapes as desired by a user. The user interface mounting module need not be shaped substantially as a square as illustrated, but may assume other shapes, such as a rectangle, circle, or triangle.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A user interface mounting module for mounting a user interface to an electronic system component including a chassis, the user interface mounting module comprising:
a main body having a rear face, a front face, and a plurality of sidewalls;
a recess defined by the front face and the plurality of sidewalls, the recess being configured to receive and mount the user interface to the main body;
a guide ring disposed on the rear face and extending in a rear direction from the rear face; and
an indexing detent attached to a spring affixed to the rear face, the indexing detent biased by the spring in a rear direction from the rear face and configured to engage one or more attachment features on the chassis;
wherein the main body is configured to be secured to an external surface of the chassis in one of two positions including a first position in which the user interface is vertically oriented and the indexing detent engages the one or more attachment features and a second position in which the user interface is horizontally oriented.

2. The user interface mounting module of claim 1, wherein the electronic system component comprises a component of a UPS system.

3. The user interface mounting module of claim 2, further comprising an aperture located generally centrally in the rear face, the aperture being configured to enable an electrical connection from the user interface to the electronic system component.

4. The user interface mounting module of claim 3, further comprising a locating guide disposed on the rear face and extending in a rear direction from the rear face.

5. The user interface mounting module of claim 4, further comprising a locking tab flexibly affixed to the rear face and extending in a rear direction from the rear face.

6. The user interface mounting module of claim 5, wherein the main body is configured to rotate between the first and the second position upon application to the main body of a solely rotational force relative to the external surface of the chassis.

7. The user interface mounting module of claim 5, further comprising a stopper affixed to the rear face and extending in a rear direction from the rear face.

8. The user interface mounting module of claim 7, wherein the stopper is disposed between the rear face and the external surface of the chassis upon securing the main body to the external surface of the chassis.

9. The user interface mounting module of claim 8, wherein the stopper is in contact with the external surface of the chassis upon securing the main body to the external surface of the chassis.

10. An electronic system component comprising:
a chassis configured to house components of the electronic system component and to receive a user interface on an external surface thereof, the chassis including an external wall having an attachment aperture, a guide slot having a locking tab insertion area which has a width greater than a remainder of the guide slot, and one or more mounting features; and
a user interface mounting module including
a main body having a rear face, a front face, and a plurality of sidewalls;
a recess configured to receive and mount a user interface module in the user interface mounting module;
a guide ring disposed on the rear face and extending in a rear direction from the rear face and configured to pass through the attachment aperture; and
an indexing detent attached to a spring affixed to the rear face, the indexing detent biased by the spring in a rear direction from the rear face and configured to engage the one or more mounting features on the chassis;
wherein the main body is configured to be secured to the chassis in one of two positions including a first position in which the user interface is vertically oriented and the indexing detent engages the one or more mounting features and a second position in which the user interface is horizontally oriented.

11. The electronic system component of claim 10, wherein the attachment aperture is configured to retain a portion of the user interface mounting module and provide for rotation of the user interface mounting module with respect to the chassis.

12. The electronic system component of claim 10, wherein the electronic system component comprises a component of a UPS system.

13. The electronic system component of claim 10, wherein the indexing detent is configured to releasably lock the user interface mounting module in place in one of the first and second positions.

14. The electronic system component of claim 10, wherein the main body of the user interface mounting module further includes an aperture located generally centrally in the rear face.

15. The electronic system component of claim 14, wherein the one or more mounting features comprise a dimple formed on an internal wall of the chassis.

16. The electronic system component of claim 15, wherein the user interface mounting module further includes a locating guide disposed on the rear face and extending in a rear direction from the rear face.

17. The electronic system component of claim 16, wherein the user interface mounting module further includes a locking tab flexibly affixed to the rear face and extending in a rear direction from the rear face.

18. The electronic system component of claim 17, wherein the user interface mounting module further includes a stopper affixed to the rear face and extending in a rear direction from the rear face.

19. A method of securing a user interface to a chassis of an electronic system component, the method comprising:
   providing a user interface mounting module including a main body having a rear face, a front face, and a plurality of sidewalls, a recess configured to receive and mount the user interface in the user interface mounting module a guide ring disposed on the rear face and extending in a rear direction from the rear face, a locking tab flexibly affixed to the rear face and extending in a rear direction from the rear face, and an indexing detent attached to a spring affixed to the rear face, the indexing detent biased by the spring in a rear direction from the rear face and configured to engage one or more attachment features on the chassis;
   securing the one of the guide ring and the locking tab in an aperture formed in an external wall of the chassis, the one of the guide ring and the locking tab and aperture configured to provide for the main body of the user interface mounting module to rotate with respect to the chassis between one of two positions including a first position in which the user interface is vertically oriented and a second position in which the user interface is horizontally oriented while the mounting feature is secured in the aperture upon application of a solely rotational force; and
   securing the user interface to the user interface mounting module.

20. The method of claim 19, further comprising rotating the user interface mounting module with respect to the chassis and releasably locking the user interface mounting module in place in one of the first position and the second position.

* * * * *